United States Patent
Sato et al.

(10) Patent No.: US 10,666,130 B2
(45) Date of Patent: May 26, 2020

(54) ELECTRIC POWER CONVERSION SYSTEM

(71) Applicants: CENTRAL JAPAN RAILWAY COMPANY, Nagoya-shi (JP); Toshiba Infrastructure Systems & Solutions Corporation, Kawasaki-shi (JP)

(72) Inventors: Kenji Sato, Nagoya (JP); Hirokazu Kato, Nagoya (JP); Takafumi Fukushima, Nagoya (JP); Hiroaki Otani, Fuchu (JP); Tomoyuki Makino, Iruma (JP); Toshiyuki Uchida, Kiyose (JP); Manato Mori, Arakawa (JP)

(73) Assignees: CENTRAL JAPAN RAILWAY COMPANY, Nagoya-shi (JP); Toshiba Infrastructure Systems & Solutions Corporation, Kawasaki-shi (JP)

( * ) Notice: Subject to any disclaimer, the term of this patent is extended or adjusted under 35 U.S.C. 154(b) by 0 days.

(21) Appl. No.: 16/127,991

(22) Filed: Sep. 11, 2018

(65) Prior Publication Data
US 2019/0081552 A1    Mar. 14, 2019

(30) Foreign Application Priority Data

Sep. 14, 2017   (JP) .................................. 2017-177120

(51) Int. Cl.
*H02M 1/36* (2007.01)
*H02H 7/12* (2006.01)

(52) U.S. Cl.
CPC ............ *H02M 1/36* (2013.01); *H02H 7/1213* (2013.01)

(58) Field of Classification Search
CPC ............................. G06F 1/28; H02H 7/12–127
See application file for complete search history.

(56) References Cited

U.S. PATENT DOCUMENTS

| 4,066,133 A * | 1/1978 | Voss ...................... B25B 23/147 173/182 |
| 9,705,408 B2 * | 7/2017 | Quigley ............ H02M 3/33507 |
| 2004/0181698 A1 * | 9/2004 | Williams ................... G06F 1/28 713/300 |

(Continued)

FOREIGN PATENT DOCUMENTS

| JP | 64-12813 A | 1/1989 |
| JP | 2017-127167 A | 7/2017 |

*Primary Examiner* — Gary L Laxton
*Assistant Examiner* — Peter M Novak
(74) *Attorney, Agent, or Firm* — Oblon, McClelland, Maier & Neustadt, L.L.P.

(57) ABSTRACT

According to one embodiment, an electric power conversion system includes a convertor, a detector, a delay controller, and a determinator. The detector is configured to detect information related to a voltage of electric power converted by the converter. The delay controller is configured to delay a conversion operation start of the converter by a first predetermined time with respect to a supply start time at which supply of the electric power is started. The determinator is configured to perform a first determination on the basis of a detection result detected by the detector before elapse of the first predetermined time from the supply start tune, and to perform a second determination on the basis of a detection result detected by the detector after the elapse of the first predetermined time from the supply start time.

9 Claims, 3 Drawing Sheets (56) References Cited

U.S. PATENT DOCUMENTS

| | | | | |
|---|---|---|---|---|
| 2012/0126733 A1* | 5/2012 | El-Refaie | ................ | H02P 27/08 |
| | | | | 318/400.26 |
| 2012/0281444 A1* | 11/2012 | Dent | ................ | H02M 7/53871 |
| | | | | 363/56.01 |
| 2014/0191605 A1* | 7/2014 | Mauch | ................ | H02K 5/10 |
| | | | | 310/91 |

* cited by examiner

(a) ELECTRIC POWER SUPPLY (b) GATE ELECTRIC POWER SUPPLY OUTPUT (c) FAN ELECTRIC POWER SUPPLY OUTPUT (d) STARTUP OF CONTROLLER 28

(e) GATE ELECTRIC POWER SUPPLY ABNORMALITY OUTPUT (f) FAN ELECTRIC POWER SUPPLY ABNORMALITY OUTPUT

FIG. 3

ELECTRIC POWER CONVERSION SYSTEM

CROSS-REFERENCE TO RELATED APPLICATION

This application is based upon and claims the benefit of priority from Japanese Patent Application No. 2017-177120 filed on Sep. 14, 2017, the entire contents of which are incorporated herein by reference.

FIELD

Embodiments described herein relate generally to an electric power conversion system.

BACKGROUND

An electric power conversion device which converts electric power supplied from an electric power supply is known. Further, a stabilized DC electric power supply device which outputs an alarm signal when an input electric power supply reaches an abnormal voltage for a predetermined time or longer is also known.

By the way, it is preferable that the soundness of an electric power conversion system be able to determine to a better extent.

DETAILED DESCRIPTION OF THE INVENTION

According to one embodiment, an electric power conversion system includes a convertor, a detector, a delay controller, and a determinator. The converter is configured to convert electric power supplied from an electric power supply. The detector is configured to detect information related to a voltage of the electric power converted by the converter. The delay controller is as a part of the converter or outside the converter. The delay controller is configured to delay a conversion operation start of the converter by a first predetermined time with respect to a supply start time at which supply of the electric power from the electric power supply is started. The determinator is configured to perform a first determination on the basis of a detection result detected by the detector before elapse of the first predetermined time from the supply start time, and to perform a second determination on the basis of a detection result detected by the detector after the elapse of the first predetermined time from the supply start time.

Hereinafter, the electric power conversion system according to an embodiment will be described with reference to the drawings. In the following description, components having the same or similar functions are denoted by the same reference numerals. Further, in some cases, duplicate explanations of these components may be omitted. In addition, the term "connected" as used herein includes a case of being electrically connected.

An electric power conversion system 1 of the embodiment will be described with reference to FIGS. 1 to 3.

Figure 1:
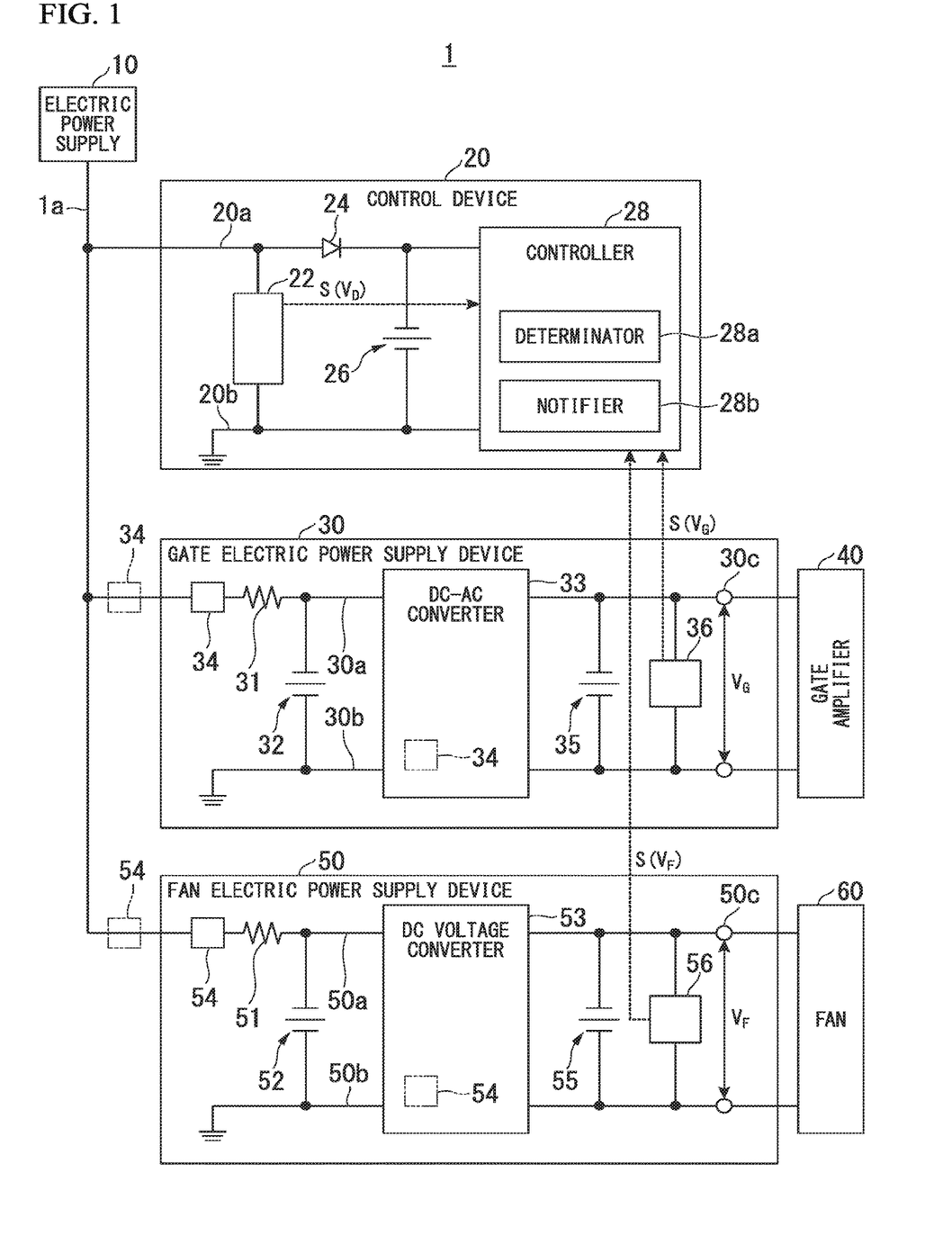
FIG. 1 is a block diagram illustrating an electric power conversion system according to an embodiment.

FIG. 1 is a block diagram illustrating an electric power conversion system 1 according to an embodiment. The electric power conversion system 1 converts DC (Direct Current) electric power supplied, for example, from an overhead wire via a pantograph, and supplies the converted electric power to a motor (not illustrated) of a vehicle to generate a driving force for the vehicle. As illustrated in FIG. 1, the electric power conversion system 1 includes, for example, an electric power supply 10, a control device 20, a gate electric power supply device 30, a gate amplifier 40, a fan electric power supply device 50, and a fan 60.

The electric power supply 10 includes, for example, a battery and a relay circuit mounted on the vehicle. The electric power supply 10 is connected to the control device 20, the gate electric power supply device 30, and the fan electric power supply device 50 via an electric power line 1a. The electric power supply 10 supplies the DC electric power stored in the battery to the control device 20, the gate electric power supply device 30, and the fan electric power supply device 50 by the relay circuit being brought into a conducting state. The electric power supply 10 stops the supply of the DC electric power by switching the relay circuit from the conducting state to a disconnected state. A voltage value of the DC electric power supplied from the electric power supply 10 to each part is $V_D$. $V_D$ is, for example, 100 V.

Next, the control device 20 will be described. The control device 20 includes, for example, a voltage detector 22, a diode 24, a capacitor 26, and a controller 28.

The voltage detector 22 is a voltmeter that measures the voltage value of the DC electric power supplied from the electric power supply 10. The voltage detector 22 is connected to a negative electrode line 20b and a positive electrode line 20a to which the voltage of the DC electric power supplied from the electric power supply 10 is applied. The voltage detector 22 detects the voltage value $V_D$ of the DC electric power supplied from the electric power supply 10. The voltage detector 22 outputs a signal S ($V_D$) indicating the detected voltage value $V_D$ to the controller 28.

The diode 24 is provided at the positive electrode line 20a between the electric power input side of the control device 20 and the controller 28. Since the cathode of the diode 24 is provided on the controller 28 side, the diode 24 prevents a current from flowing from the controller 28 side to the electric power supply 10 side.

The capacitor 26 is connected to the negative electrode line 20b and the positive electrode line 20a to which the voltage of the DC electric power supplied from the electric power supply 10 is applied. The capacitor 26 has a capacity capable of storing the electric power by which the controller 28 can operate over a predetermined period in a case where the supply of the DC electric power from the electric power supply 10 is stopped. That is, the capacity of the capacitor 26 is calculated on the basis of the electric power consumption per unit time of the controller 28 and a predetermined period during which the controller 28 may operate after the supply of the DC electric power from the electric power supply 10 is stopped.

All or a part of the controller 28 is a functional unit (hereinafter referred to as a software function unit) realized by executing a program stored in a storage unit such as a memory unit, using a processor such as a CPU (Central Processing Unit). Further, all or a part of the controller 28 may be achieved by hardware such as an LSI (Large Scale Integration), an ASIC (Application Specific Integrated Circuit) or a FPGA (Field-Programmable Gate Array), and may be achieved by a combination of a software function unit and hardware. In the following description, an example in which the controller 28 includes a processor such as a CPU will be described, but the configuration of the embodiment is not limited thereto.

The controller 28 of the present embodiment requires several seconds (for example, 4 to 6 seconds) from the start of startup from a stopped state to completion of the startup. That is, the controller 28 requires several seconds (for example, 4 to 6 seconds) until the startup (starting) of the CPU (processor) is completed. Therefore, just after the supply of electric power from the electric power supply 10 to the control device 20 is started, the controller 28 cannot start a determination process or the like to be described later. The expression "the startup of CPU is completed" means that, for example, the CPU is in a state in which it is possible to execute processes different from the startup.

In the present embodiment, the controller 28 starts the startup substantially at the same time as a supply start time at which the supply of electric power from the electric power supply 10 to the control device 20 is started. Further, the start of startup of the controller 28 is not limited to substantially being at the same time as the supply start time, and may be later than the supply start time.

By receiving the signal S ($V_D$) indicating the voltage value $V_D$ from the voltage detector 22, the controller 28 can recognize that electric power is being supplied from the electric power supply 10 to the electric power line 1a normally.

Further, the controller 28 of the present embodiment includes a determinator (determination unit) 28a and a notifier (notification unit or reporting unit) 28h. The determinator 28a performs a first determination and a second determination in order to determine the soundness of the electric power conversion system 1. In a case where it is determined that there is an abnormality in one of the first determination and the second determination, the notifier 28b executes a predetermined process. The determinator 28a and the notifier 28b will be described in detail later.

Next, the gate electric power supply device 30 will be described. The gate electric power supply device 30 is an example of an "electric power conversion device". The gate electric power supply device 30 includes, for example, a resistor 31, an input-side capacitor 32, a DC/AC (Direct Current/Alternating Current) converter (converter) 33, a delay controller 34, an output-side capacitor 35, and a voltage detector (detector) 36.

A resistor 31 is provided at the positive electrode line 30a connected to the electric power line 1a. The resistor 31 suppresses a large inrush current from flowing to the DC/AC converter 33. An input-side capacitor 32 is connected to the positive electrode line 30a and the negative electrode line 30b on the DC/AC converter 33 side of the resistor 31. The DC electric power is supplied to the input-side capacitor 32 via the resistor 31. The input-side capacitor 32 stores the DC electric power supplied via the resistor 31. The electric power stored in the input-side capacitor 32 is consumed by the DC/AC converter 33 in a case where the DC electric power from the electric power supply 10 is cut off.

The DC/AC converter 33 is a switching circuit including a plurality of semiconductor switching elements and a control circuit (driver) for controlling turning the plurality of semiconductor switching elements on/off. The DC/AC converter 33 converts the DC electric power supplied from the electric power supply 10 via the input-side capacitor 32 into AC electric power. For example, the DC/AC converter 33 converts the DC electric power of 100 V into AC electric power having amplitude of 50 V.

The delay controller 34 delays the conversion operation start of the DC/AC converter 33 by a first predetermined time $T1_G$ with respect to the supply start time at which the supply of electric power from the electric power supply 10 to the gate electric power supply device 30 is started. The first predetermined time $T1_G$ is a time longer than the time required for the startup of the controller 28 (the determinator 28a). In the present embodiment, the first predetermined time $T1_G$ is set to 10 seconds, which is a time longer than the time (4 to 6 seconds) required for the startup of the controller 28 (the determinator 28a). However, a specific example of the first predetermined time $T1_G$ is not limited to the above example and can be set as appropriate.

The delay controller 34 is provided, for example, on the side closer to the electric power input of the gate electric power supply device 30 than the resistor 31 and the capacitor 32. The delay controller 34 includes, for example, a switching component provided at the positive electrode line 30a to switch the positive electrode line 30a between a conducting state and a disconnected state, an RC circuit (a delay circuit) to which the electric power is supplied from the electric power supply 10, and a comparator which outputs a signal for controlling the switching component such that it switches the positive electrode line 30a to the conducting state when the output of the RC circuit exceeds a threshold value, or the like. A length of the first predetermined time $T1_G$ is adjusted, for example, by the capacitor capacitance or the like of the RC circuit. However, the configuration of the delay controller 34 is not limited to the above example. For example, the delay controller 34 may be formed by the switching component provided at the positive electrode line 30a and various IC (integrated circuit) components for controlling the switching component.

Further, the delay controller 34 may be provided inside the DC/AC converter 33, instead of being provided outside the DC/AC converter 33. In this case, the delay controller 34 may be provided integrally with the control circuit (driver) included in the DC/AC converter 33, or may be provided separately from the control circuit. Further, the delay controller 34 is not limited to the case of being provided inside the gate electric power supply device 30, and may be provided outside the gate electric power supply device 30 (refer to an alternating two dots-dashed line in FIG. 1). Furthermore, the delay controller 34 is not limited to a case of being achieved by hardware, and may be achieved by a software function unit, or may be achieved by a combination of a software function unit and hardware.

The output-side capacitor 35 is connected to the positive electrode line 30a and the negative electrode line 30b on the side closer to the output terminal 30c than the DC/AC converter 33. The output-side capacitor 35 stores the electric power which is output from the DC/AC converter 33.

The voltage detector 36 has a voltmeter and a comparator. The voltmeter is connected to the positive electrode line 30a and the negative electrode line 30b and measures an output voltage value $V_G$ of the gate electric power supply device 30. The comparator compares the voltage value $V_G$ measured by the voltmeter with a predetermined threshold value (a first threshold value $S1_G$, and a second threshold value $S2_G$). The comparison result obtained by the comparator is an example of "information related to the voltage of the electric power converted by the DC/AC converter 33". The expression "information related to the voltage" in the present specification is not limited to the comparison result obtained by the comparator, but may be a voltage value itself or a current value or the like from which a voltage value can be calculated by combination with a resistance value or the like. In the following description, an example in which the comparison result obtained by the comparator is output as "information related to the voltage" will be described.

As a detection result of the voltage detector 36, the voltage detector 36 outputs a signal (a signal indicating whether the voltage value $V_G$ is higher or lower than the predetermined threshold) S ($V_G$) indicating the comparison result obtained by the comparator to the signal input unit of the controller 28 of the control device 20, for example, via a digital line (not illustrated). For example, in a case where the supply of electric power from the electric power supply 10 to the gate electric power supply device 30 is started, the voltage detector 36 outputs the signal S ($V_G$) indicating the comparison result obtained by the comparator to the controller 28 of the control device 20 at predetermined time intervals even in a state in which the DC/AC converter 33 is stopped (a state before the conversion operation is started).

Next, the gate amplifier 40 will be described. The gate amplifier 40 is supplied with the AC electric power converted by the DC/AC converter 33. An inverter circuit (not illustrated) for supplying the driving electric power to a drive motor of the vehicle is connected to the gate amplifier 40. The gate amplifier 40 controls turning on/off of the semiconductor switching elements, by supplying control signals to the gate terminals of the semiconductor switching elements in the inverter circuit.

Next, the fan electric power supply device 50 will be described. The fan electric power supply device 50 is another example of the "electric power conversion device". The fan electric power supply device 50 includes, for example, a resistor 51, an input-side capacitor 52, a DC voltage converter (converter) 53, a delay controller 54, an output-side capacitor 55, and a voltage detector (detector) 56.

The resistor 51 is provided at the positive electrode line 50a connected to the electric power line 1a. The resistor 51 suppresses a large inrush current from flowing to the DC voltage converter 53. The input-side capacitor 52 is connected to the positive electrode line 50a and the negative electrode line 50b on the side closer to the DC voltage converter 53 than the resistor 51. The DC electric power is supplied to the input-side capacitor 52 via the resistor 51. The input-side capacitor 52 stores direct-current electric power supplied via the resistor 51. The electric power stored in the input-side capacitor 52 is consumed by the DC voltage converter 53 in case where the DC electric power from the electric power supply 10 is cut off.

The DC voltage converter 53 is, for example, a DC-DC convertor including circuit components such as switching elements. The DC voltage converter 53 converts the voltage of the DC electric power supplied from the electric power supply 10 via the input-side capacitor 52. The DC voltage converter 53 converts, for example, a DC voltage of 100 V into a DC voltage of a rated voltage (for example, 24 V) of the fan 60.

The delay controller 54 delays the conversion operation start of the DC voltage converter 53 by a first predetermined time $T1_F$ with respect to the supply start time at which the supply of electric power from the electric power supply 10 to the fan electric power supply device 50 is started. The first predetermined time $T1_F$ is a time longer than the time required for the startup of the controller 28 (a determinator 28a). In the present embodiment, the first predetermined time $T1_F$ is set to 10 seconds, which is longer than the time (4 to 6 seconds) required for the startup of the controller 28 (the determinator 28a). However, a specific example of the first predetermined time $T1_F$ is not limited to the above example and can be set as appropriate. The first predetermined time $T1_F$ related to the DC voltage converter 53 may be the same length as the first predetermined time $T1_G$ related to the DC/AC converter 33, or may be different length.

The delay controller 54 is provided, for example, on the side closer to the electric power input side of the fan electric power supply device 50 than the resistor 51 and the capacitor 52. The delay controller 54 includes, for example, a switching component provided at the positive electrode line 50a to switch the positive electrode line 50a between a conducting state and a disconnected state, an RC circuit (a delay circuit) to which the electric power is supplied from the electric power supply 10, and a comparator which outputs a signal for controlling the switching component such that is switches the positive electrode line 50a to the conducting state when the output of the RC circuit exceeds a threshold value, or the like. A length of the first predetermined time $T1_F$ is adjusted, for example, by the capacitor capacity of the RC circuit. However, the configuration of the delay controller 54 is not limited to the above example. For example, the delay controller 54 may be formed by the switching component provided at the positive electrode line 50a and various IC components for controlling the switching component.

Further, the delay controller 54 may be provided inside the DC voltage converter 53, instead of being provided outside the DC voltage converter 53. Further, the delay controller 54 is not limited to the case of being provided inside the fan electric power supply device 50, and may be provided outside the fan electric power supply device 50 (refer to a two-dot chain line in FIG. 1). Furthermore, the delay controller 54 is not limited to a case of being achieved by hardware, but may be achieved by a software function unit, or may be achieved by a combination of the software function unit and hardware.

The output-side capacitor 55 is connected to the positive electrode line 50a and the negative electrode line 50b on the side closer to the output terminal 50c than the DC voltage converter 53. The output-side capacitor 55 stores the electric power which is output from the DC voltage converter 53.

The voltage detector 56 has a voltmeter and a comparator. The voltmeter is connected to the positive electrode line 50a and the negative electrode line 50b and measures an output voltage value $V_H$ of the fan electric power supply device 50. The comparator compares the voltage value $V_F$ measured by the voltmeter with a predetermined threshold value (a first threshold value $S1_F$, and a second threshold value $S2_F$). The comparison result obtained by the comparator is an example of "information related to the voltage of the electric power converted by the DC voltage converter 53". As a detection result of the voltage detector 56, the voltage detector 56 outputs a signal (a signal indicating whether the voltage value $V_F$ is higher or lower than the predetermined threshold) S ($V_F$) indicating the comparison result obtained by the comparator to the signal input unit of the controller 28 of the control device 20, for example, via a digital line (not illustrated). For example, in a case where the supply of electric power from the electric power supply 10 to the fan electric power supply device 50 is started, the voltage detector 56 outputs the signal S ($V_F$) indicating the comparison result obtained by the comparator to the controller 28 of the control device 20 at predetermined time intervals even in a state in which the DC voltage converter 53 is stopped (a state before the conversion operation is started).

Next, the fan 60 will be described. The fan 60 is a blower mechanism for a heat-generating component (for example, an inverter circuit) in the electric power conversion system 1. The DC electric power in which voltage is converted by the DC voltage converter 53 is supplied to the fan 60. The fan 60 consumes the DC electric power and performs the blowing operation, thereby suppressing the temperature rise in the heat-generating component.

Next, the determinator 28a and the notifier 28b of the control device 20 will be described. Specifically, in the electric power conversion system 1, the description will be given of a case in which a first determination is performed on the basis of the detection results detected by the voltage detectors 36 and 56 before elapse of the first predetermined times $T1_G$ and $T1_F$ from the supply start time at which the supply of the electric power from the electric power supply 10 is started, and a second determination is performed on the basis of the detection results detected by the voltage detectors 36 and 56 after the lapse of the first predetermined times $T1_G$ and $T1_F$ from the supply start time.

In this specification, the expression "the supply start time at which the supply of the electric power from the electric power supply 10 is started" does not mean a strict time at which the supply of electric power from the electric power supply 10 to a specific device (for example, the gate electric power supply device 30 or the fan electric power supply device 50) is started, but is the concept also including a time that has shifted due to the influence of the internal resistance of the electric power line 1a or the positive electrode lines 20a, 30a and 50a, and the internal devices or electric elements of various devices included in the electric power conversion system 1. For example, in this specification, "the time when supply of electric power from the electric power supply 10 to the electric power line 1a is started", "the time when supply of electric power from the electric power supply 10 to the control device 20 is started", "the time when supply of electric power from the electric power supply 10 to the gate electric power supply device 30 is started, and "the time when the supply of electric power from the electric power supply 10 to the fan electric power supply device 50 is started" are regarded as substantially the same time. For example, "the time when supply of electric power from the electric power supply 10 to the gate electric power supply device 30 is started" and "the time when supply of electric power from the electric power supply 10 to the fan electric power supply device 50 is started" are an example of "the supply start time at which supply of electric power from the electric power supply is started", respectively. Further, in the following description, "the supply start time at which supply of electric power from the electric power supply is started" is simply referred to as an "electric power supply start time" or "supply start time".

Figure 2:
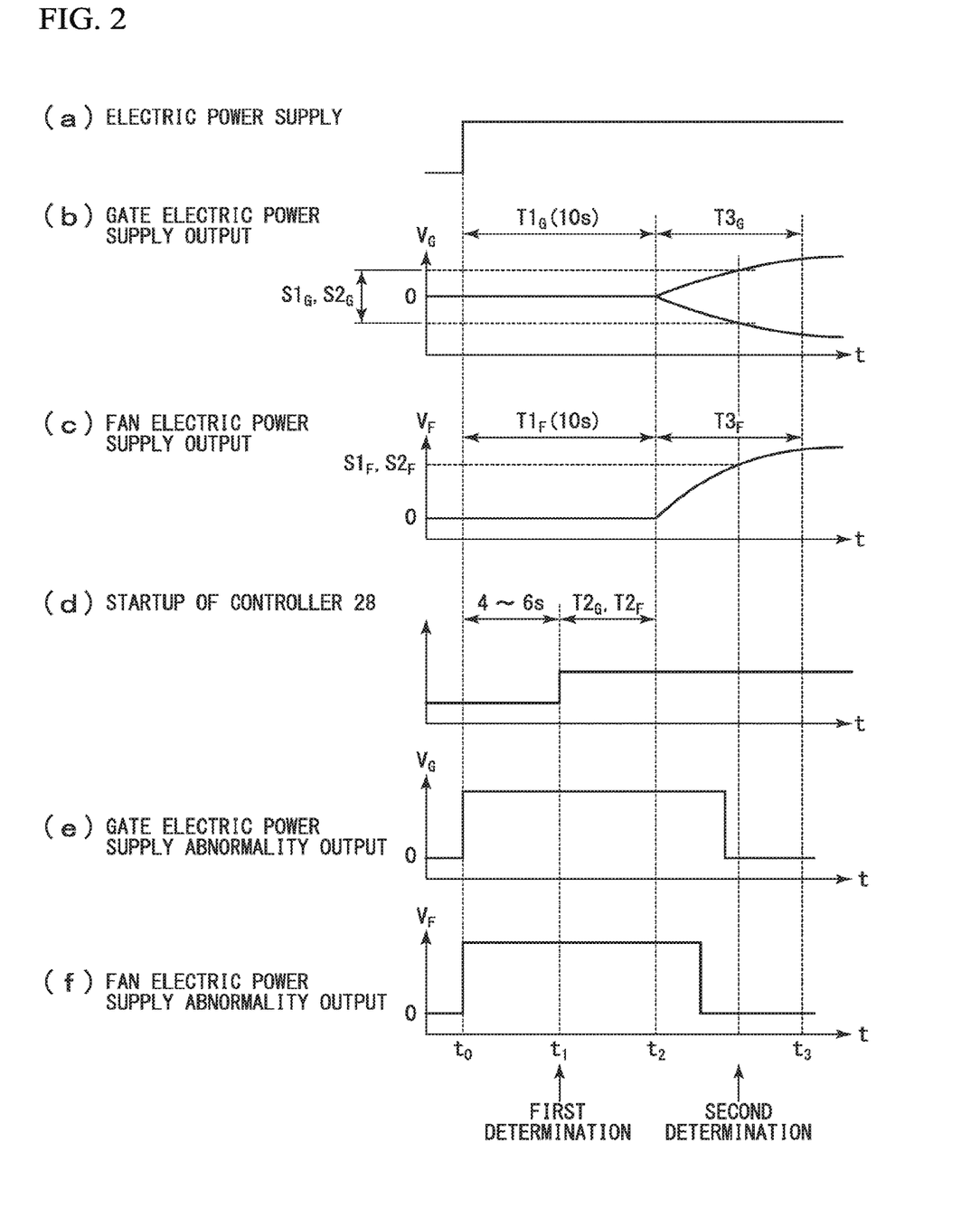
FIG. 2 is a timing chart illustrating an example of various operation timings of the electric power conversion system according to the embodiment.

FIG. 2 is a timing chart illustrating an example of various operation timings of the electric power conversion system 1. (a) in FIG. 2 illustrates the voltage value of the electric power supplied from the electric power supply 10 to the electric power conversion system 1. This voltage value corresponds to, for example, the voltage value $V_D$ detected by the voltage detector 22 of the control device 20. In the example illustrated in FIG. 2, the time $t_0$ is the electric power supply start time.

(b) in FIG. 2 illustrates the output voltage value VG converted by the DC/AC converter 33 of the gate electric power supply device 30 and is output from the gate electric power supply device 30. The voltage value $V_G$ is a voltage value $V_G$ detected by the voltage detector 36 of the gate electric power supply device 30. In the example illustrated in FIG. 2, the time $t_2$ is a conversion operation start time of the of the DC/AC converter 33. That is, the time between the time $t_0$ and the time $t_2$ corresponds to the first predetermined time $T1_G$ in which the start of the conversion operation of the DC/AC converter 33 is delayed by the delay controller 34. When the DC electric power is supplied from the electric power supply 10 to the gate electric power supply device 30, the electric power is first charged in the input-side capacitor 32. In the DC/AC converter 33, as the electric power is accumulated in the input-side capacitor 32, the magnitude of the electric power to be converted increases. As a result, as illustrated in (b) of FIG. 2, the voltage value $V_G$ of the AC electric power which is output from the DC/AC converter 33 gradually increases.

(c) of FIG. 2 illustrates the output voltage value $V_F$ which is converted by the DC voltage converter 53 of the fan electric power supply device 50 and output from the fan electric power supply device 50. This voltage value $V_F$ is a voltage value $V_F$ detected by the voltage detector 56 of the fan electric power supply device 50. In the example illustrated in FIG. 2, the time $t_2$ is at the conversion operation start time of the DC voltage converter 53. That is, the time between the time $t_0$ and the time $t_2$ corresponds to the first predetermined time $T1_F$ at which the start of the conversion operation of the DC voltage converter 53 is delayed by the delay controller 54. When the DC electric power is supplied from the electric power supply 10 to the fan electric power supply device 50, the electric power is first charged in the input-side capacitor 52. In the DC voltage converter 53, as the electric power is accumulated in the input-side capacitor 52, the magnitude of the electric power to be converted increases. As a result, as illustrated in (c) in FIG. 2, the voltage value $V_F$ of the DC electric power which is output from the DC voltage converter 53 gradually increases.

(d) in FIG. 2 illustrates the operation state of the controller 28 (determinator 28a) of the control device 20. In the example illustrated in FIG. 2, the controller 28 starts the startup at the time $t_0$ and completes the startup at the time $t_1$. As a result, the controller 28 can perform the first determination and the second determination, which will be described later, after the time $t_1$.

(e) in FIG. 2 illustrates an example in which an abnormal voltage is detected, as the output voltage value $V_G$ which is output from the gate electric power supply device 30. In this example, a somewhat large output voltage value $V_G$ is detected before elapse of the first predetermined time $T1_G$ from the time $t_0$ which is the electric power supply start time.

(f) in FIG. 2 illustrates an example in which an abnormal voltage is detected, as the output voltage value $V_F$ which is output from the fan electric power supply device 50. In this example, a somewhat large output voltage value $V_F$ is detected before elapse of the first predetermined time $T1_F$ from the time t0 which the electric power supply start time.

Next, the determination of the soundness of the gate electric power supply device 30 will be described referring to FIG. 2.

First, the determinator 28a performs the first determination on the basis of the detection result detected by the voltage detector 36 before the elapse of the first predetermined time $T1_G$ from the electric power supply start time (time $t_0$). That is, the determinator 28a performs the first determination in a state in which the DC/AC converter 33 does not start the conversion operation.

As the first determination, the determinator 28a determines whether or not the voltage value $V_G$ detected by the voltage detector 36 is equal to or greater than a first threshold value $S1_G$. In this embodiment, the determinator 28a determines whether the voltage value $V_G$ detected by the voltage detector 36 is equal to or greater than the first threshold $S1_G$ on the basis of the signal S ($V_G$) indicating the comparison result obtained by the comparator which is output from the voltage detector 36. That is, the expression "determining whether or not the value related to the voltage is equal to or greater than the threshold value (or the voltage exceeds the threshold value)" in this specification is not limited to the case of making a determination directly on the basis of the voltage value, but also includes a case of making a determination on the basis of the signal indicating the result compared with a threshold value by the comparator. The first threshold value $S1_G$ is set to a voltage value that is not output in a state in which the DC/AC converter 33 does not start the conversion operation. Further, the first threshold value $S1_G$ is not particularly limited as long as it is a threshold value that can determine whether or not the voltage value $V_G$ detected by the voltage detector 36 is substantially 0 V, for example. In the first determination, when the voltage value $V_G$ detected by the voltage detector 36 is less than the first threshold value $S1_G$ (when the signal S ($V_G$) indicating that the voltage value $V_G$ is less than the first threshold value $S1_G$ is output from the voltage detector 36), the determinator 28a determines that there is no abnormality. On the other hand, in the first determination, when the voltage value $V_G$ detected by the voltage detector 36 is equal to or greater than the first threshold value $S1_G$ (when the signal S ($V_G$) indicating that the voltage value $V_G$ is equal to or greater than the first threshold value $S1_G$ is output from the voltage detector 36), the determinator 28a determines that there is an abnormality. When it is determined that there is an abnormality in the first determination, the determinator 28a outputs a signal indicating that there is an abnormality to the notifier 28b.

In the present embodiment, the determinator 28a performs the first determination substantially at the same time (time t1) as the startup completion of the determinator 28a. In place of the above, the determinator 28a may perform the first determination within a second predetermined time $T2_G$ from the startup completion of the determinator 28a. The second predetermined time $T2_G$ is not particularly limited as long as it is the time at which the first determination can be performed before the conversion operation of the DC/AC converter 33 is started. The second predetermined time $T2_G$ is set in advance in the memory unit which can be referred to by the determinator 28a depending on the time required for startup of the determinator 28a.

Next, the determinator 28a performs the second determination on the basis of the detection result detected by the voltage detector 36 after the elapse of the first predetermined time $T1_G$ from the electric power supply start time (time $t_0$). That is, the determinator 28a performs the second determination after the DC/AC converter 33 starts the conversion operation. Further, the expression "performing the second determination after the elapse of the first predetermined time $T1_G$" is not limited to the case where the second determination is performed just after the lapse of the first predetermined time $T1_G$, but also includes a case where the second determination is performed at a predetermined timing after the lapse of the first predetermined time $T1_G$.

As a second determination, the determinator 28a determines whether or not the voltage value $V_G$ detected by the voltage detector 36 exceeds a second threshold value $S2_G$. In this embodiment, on the basis of the signal S ($V_G$) indicating the comparison result obtained by the comparator which is output from the voltage detector 36, the determinator 28a determines whether the voltage value $V_G$ detected by the voltage detector 36 exceeds the second threshold value $S2_G$. The second threshold value $S2_G$ is set to a voltage value that is equal to or greater than a predetermined value, and is a value smaller than the voltage value which is output from the DC/AC converter 33 in a state where the DC/AC converter 33 normally operates. In the second determination, when the voltage value $V_G$ detected by the voltage detector 36 exceeds the second threshold value $S2_G$ (when a signal indicating that the voltage value $V_G$ exceeds the second threshold value $S2_G$ is output from the voltage detector 36), the determinator 28a determines that there is no abnormality. On the other hand, in the second determination, when the voltage value $V_G$ detected by the voltage detector 36 does not exceed the second threshold value $S2_G$ (when the signal indicating that the voltage value $V_G$ is less than the second threshold value $S2_G$ is continuously output from the voltage detector 36), the determinator 28a determines that there is an abnormality. When it is determined that there is an abnormality in the second determination, the determinator 28a outputs a signal indicating that there is an abnormality to the notifier 28b. Further, the first threshold value $S1_G$ and the second threshold value $S2_G$ may be the same as each other or may be different from each other.

In the present embodiment, as the second determination, the determinator 28a determines whether or not the voltage value $V_G$ detected by the voltage detector 36 exceeds the second threshold value $S2_G$ within a third predetermined time T3 which is set after the conversion operation start time of the DC/AC converter 33 (that is, the time $t_2$ when the first predetermined time $T1_G$ elapses from the electric power supply start time). For example, the determinator 28a monitors the signal S ($V_G$) indicating the comparison result obtained by the comparator of the voltage detector 36 at a predetermined cycle, and performs the second determination, by determining whether the voltage value $V_G$ exceeds the second threshold value $S2_G$ before the third predetermined time $T3_G$ elapses. The third predetermined time $T3_G$ is preset in the memory unit that can be referred to by the determinator 28a.

Further, the expression "determining whether the voltage value $V_G$ detected by the voltage detector 36 exceeds the second threshold value $S2_G$ within the third predetermined time $T3_G$" is not limited to the above example. For example, instead of the above, the determinator 28a does not monitor the signal S ($V_G$) indicating the comparison result obtained by the comparator of the voltage detector 36 at a predetermined cycle, and may perform the second determination, by determining whether or not the voltage value $V_G$ detected by the voltage detector 36 is equal to or greater than the second threshold value $S2_G$ when the third predetermined time $T3_G$ elapses.

Next, the determination of the soundness of the fan electric power supply device 50 will be described.

First, the determinator 28a performs the first determination on the basis of the detection result detected by the voltage detector 56 before the elapse of the first predetermined time $T1_F$ from the electric power supply start time (time $t_0$). That is, the determinator 28a performs the first determination in a state in which the DC voltage converter 53 does not start the conversion operation.

As the first determination, the determinator 28a determines whether the voltage value $V_F$ detected by the voltage detector 56 is equal to or greater than a first threshold value $S1_F$. In the present embodiment, the determinator 28a determines whether the voltage value $V_F$ detected by the voltage detector 56 is equal to or greater than the first threshold $S1_F$, on the basis of the signal S ($V_F$) indicating the comparison result of the comparator which is output from the voltage detector 56. The first threshold value $S1_F$ is set to a voltage value that is not output in a state in which the DC voltage converter 53 does not start the conversion operation. Further, the first threshold value $S1_F$ is not particularly limited as long as it is a threshold value that can determine whether the voltage value $V_F$ detected by the voltage detector 56 is substantially 0 V, for example. In the first determination, when the voltage value $V_F$ detected by the voltage detector 56 is less than the first threshold value $S1_F$ (when the signal S ($V_F$) indicating that the voltage value $V_F$ is less than the first threshold value $S1_F$) is output from the voltage detector 56), the determinator 28a determines that there is no abnormality. On the other hand, in the first determination, when the voltage value $V_F$ detected by the voltage detector 56 is equal to or greater than the first threshold value $S1_F$ (when the signal S ($V_F$) indicating that the voltage value $V_F$ is equal to or greater than the first threshold value $S1_F$ is output from the voltage detector 56), the determinator 28a determines that there is an abnormality. When it is determined that there is an abnormality in the first determination, the determinator 28a outputs the signal indicating abnormality to the notifier 28b.

In the present embodiment, the determinator 28a performs the first determination substantially at the same time (time to as the startup completion of the determinator 28a. Instead of the above, the determinator 28a may perform the first determination within a second predetermined time $T2_F$ from the startup completion of the determinator 28a. The second predetermined time $T2_F$ is not particularly limited as long as it is the time that can perform the first determination before the conversion operation of the DC voltage converter 53 is started. The second predetermined time period $T2_F$ is preset in the memory unit that can be referred to by the determinator 28a depending on the time required for startup of the determinator 28a.

Next, the determinator 28a performs a second determination on the basis of the detection result detected by the voltage detector 56 after the elapse of a first predetermined time $T1_F$ from the electric power supply start time (time $t_0$). That is, the determinator 28a performs the second determination after the DC voltage converter 53 starts the conversion operation. The expression "performing the second determination after the elapse of the first predetermined time $T1_F$" is not limited to the case where the second determination is performed just after the lapse of the first predetermined time $T1_F$, but also include a case where the second determination is performed at a predetermined timing after the lapse of the first predetermined time $T1_F$.

As the second determination, the determinator 28a determines whether or not the voltage value $V_F$ detected by the voltage detector 56 exceeds a second threshold value $S2_F$. In the present embodiment, the determinator 28a determines whether the voltage value $V_F$ detected by the voltage detector 56 exceeds the second threshold $S2_F$, on the basis of the signal S ($V_F$) indicating the comparison result of the comparator of the voltage detector 56 which is output from the voltage detector 56. The second threshold value $S2_F$ is set to a voltage value that is equal to or larger than a predetermined value, and is a value smaller than the voltage value which is output from the DC voltage converter 53 in a state where the DC voltage converter 53 operates normally. In the second determination, when the voltage value $V_F$ detected by the voltage detector 56 exceeds the second threshold value $S2_F$ (when the signal indicating that the voltage value $V_F$ exceeds the second threshold value $S2_F$ is output from the voltage detector 56), the determinator 28a determines that there is no abnormality. On the other hand, in the second determination, when the voltage value $V_F$ detected by the voltage detector 56 does not exceed the second threshold value $S2_F$ (when the signal indicating that the voltage value $V_F$ is less than the second threshold value $S2_F$ is continuously output from the voltage detector 56), the determinator 28a determines that there is an abnormality. When it is determined that there is an abnormality in the second determination, the determinator 28a outputs a signal indicating that there is an abnormality to the notifier 28b. Further, the first threshold value $S1_F$ and the second threshold value $S2_F$ may be the same as each other or may be different from each other.

In the present embodiment, as the second determination, the determinator 28a determines whether or not the voltage value $V_F$ detected by the voltage detector 56 exceeds the second threshold value $S2_F$ within the third predetermined time $T3_F$ which is set after the conversion operation start time of the DC electric power converter 53 (that is, at the time $t_2$ when the first predetermined time $T1_F$ elapses from the electric power supply start time). For example, the determinator 28a monitors the signal S ($V_F$) indicating the comparison result obtained by the comparator of the voltage detector 56 at a predetermined cycle, and performs the second determination, by determining whether the voltage value $V_F$ exceeds the second threshold value $S2_F$ before the third predetermined time $T3_F$ elapses. The third predetermined time $T3_F$ is preset in the memory unit that can be referred to by the determinator 28a.

Further, the expression "determining whether the voltage value $V_F$ detected by the voltage detector 56 exceeds the second threshold value $S2_F$ within the third predetermined time $T3_F$" is not limited to the above example. For example, instead of the above, the determinator 28a does not monitor the signal S ($V_F$) indicating the comparison result obtained by the comparator of the voltage detector 56 at a predetermined cycle, and may perform the second determination by determining whether the voltage value $V_F$ detected by the voltage detector 56 is equal to or greater than the second threshold value $S2_F$ when the third predetermined time $T3_F$ elapses.

When it is determined that there is an abnormality in the first determination or the second determination regarding the gate electric power supply device 30 or the fan electric power supply device 50, the notifier 28b receives the signal indicating that there is an abnormality from the determinator 28a. When receiving the signal indicating that there is an abnormality from the determinator 28a, the notifier 28b performs a predetermined process. The predetermined process is a process of sending a control instruction to a display device so that predetermined information is displayed on the display device (for example, a monitor device of a cab of the vehicle), or a process of sending a control instruction to a speaker device of the cab or the like to report predetermined information to a crew member. Further, the notifier 28b may output a reporting signal to an external device as an example of a predetermined process.

Next, a flow of process of the electric power conversion system 1 of the present embodiment will be described.

Figure 3:
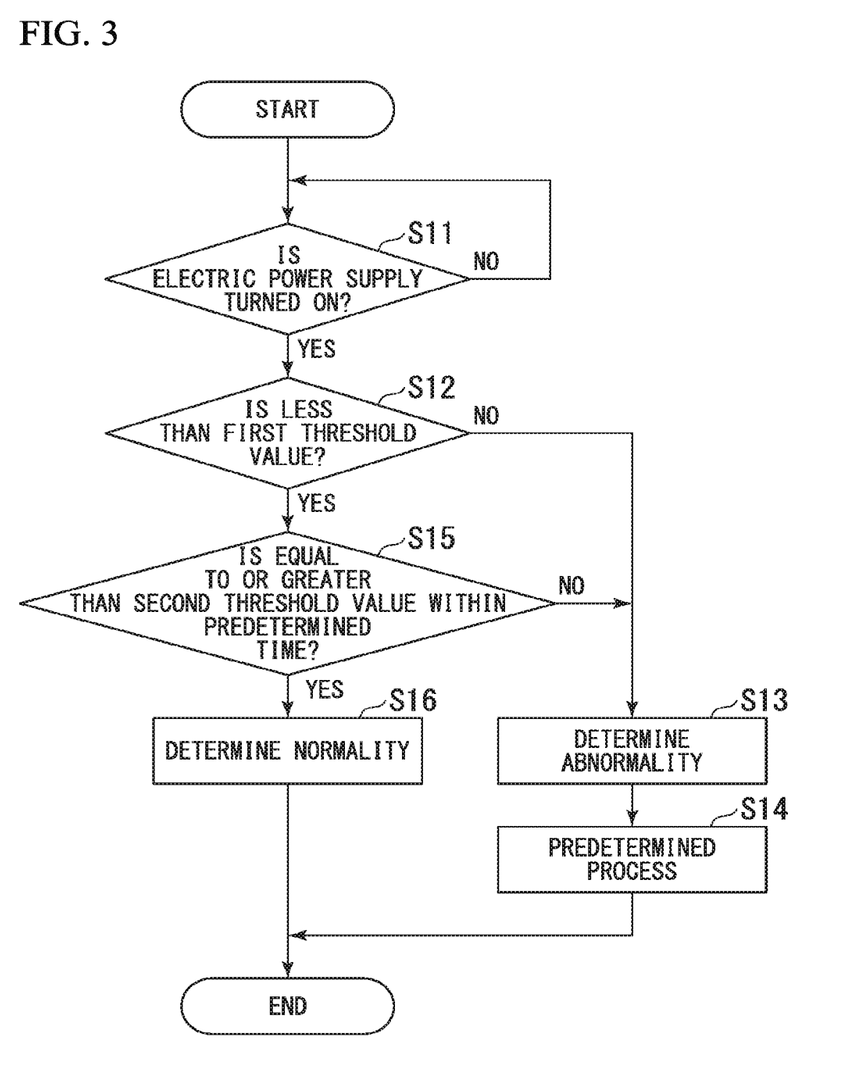
FIG. 3 is a flowchart illustrating an example of a process flow of the electric power conversion system according to the embodiment.

FIG. 3 is a flowchart illustrating an example of the flow of process of the electric power conversion system 1. As illustrated in FIG. 3, first, the determinator 28a waits until the supply of electric power from the electric power supply 10 is started (S11).

When the supply of electric power from the electric power supply 10 is started, the determinator 28a starts the startup. After the startup is completed, the determinator 28a performs the first determination regarding the gate electric power supply device 30 and the fan electric power supply device 50 (S12).

In the first determination regarding the gate electric power supply device 30 or the fan electric power supply device 50, in a case where at least one of the voltage values $V_G$ and $V_F$ of the voltages detected by the voltage detectors 36 and 56 is equal to or greater than the first threshold values $S1_G$ or $S1_F$, the determinator 28a determines that there is an abnormality (S13). In this case, the determinator 28a outputs the signal indicating that there is an abnormality to the notifier 28b. In a case where receiving the signal indicating that there is an abnormality from the determinator 28a, the notifier 28b performs the aforementioned predetermined process (S14).

On the other hand, in the first determination regarding the gate electric power supply device 30 or the fan electric power supply device 50, in a case where the voltage values $V_G$ and $V_F$ of the voltages detected by the voltage detectors 36 and 56 are less than the first threshold values $S1_G$ and $S1_F$, respectively, after waiting for a necessary time, the determinator 28a performs the second determination regarding the gate electric power supply device 30 and the fan electric power supply device 50 (S15).

In the second determination regarding the gate electric power supply device 30 or the fan electric power supply device 50, in a case where at least one of the voltage values $V_G$ and $V_F$ of the voltages detected by the voltage detectors 36 and 56 does not exceed the second threshold values $S2_G$ or $S2_F$, the determinator 28a determines that there is an abnormality (S13). In this case, the determinator 28a outputs the signal indicating that there is an abnormality to the notifier 28b. In a case where receiving the signal indicating that there is an abnormality from the determinator 28a, the notifier 28b performs the aforementioned predetermined process (S14).

On the other hand, in the second determination regarding the gate electric power supply device 30 or the fan electric power supply device 50, in a case where the voltage values $V_G$ and $V_F$ of the voltages detected by the voltage detectors 36 and 56 exceed the second threshold values $S2_G$ and $S2_F$, respectively, the determinator 28a determines that the electric power supply 10, the gate electric power supply device 30, the fan electric power supply device 50, and the control device 20 are normal (S16).

According to the electric power conversion system 1 configured as described above, it is possible to determine the soundness at a higher level. Here, as a comparative example, an electric power conversion system not having a delay controller for delaying the start of the conversion operation of the converter by a predetermined time with respect to the electric power supply start time is considered. In the electric power conversion system of the comparative example, the conversion operation of the converter is started simultaneously with the supply start of the electric power from the electric power supply, and the converted voltage is output. Therefore, as the detection result of the voltage detector that detects the output voltage of the converter, a comparatively high voltage value is detected from the electric power supply start time. For this reason, for example, in a case where the voltage detector or the signal input unit of the controller fails in a state in which the converter seems to output a relatively high voltage value, in some cases, it may be difficult to easily detect the failure of the electric power supply, the voltage detector, and the control device.

On the other hand, the electric power conversion system 1 according to the present embodiment includes converters 33 and 53 for converting electric power supplied from the electric power supply 10, detectors 36 and 56 for detecting information related to voltage of electric power converted by the converters 33 and 53, delay controllers 34 and 54 for delaying the conversion operation start of the converters 33 and 53 by the first predetermined time $T1_G$ and $T1_F$ with respect to the electric power supply start time, and a determinator 28a which performs the first determination on the basis of the detection results detected by the detectors 36 and 56 before the elapse of the first predetermined time $T1_G$ and $T1_F$ from the electric power supply start time, and performs the second determination on the basis of the detection results detected by the detectors 36 and 56 after the lapse of the first predetermined time $T1_G$ and $T1_F$ from the electric power supply start time.

According to such a configuration, by providing the delay controllers 34 and 54 for delaying the conversion operation start of the converters 33 and 53 by the first predetermined time $T1_G$ and $T1_F$, it is possible to perform the first determination on the basis of the state before the start of the conversion operation of the converters 33 and 53. As a result, even when the signal input unit of the voltage detectors 36 and 56 or the controller 28 fail in a state in which the converters 33 and 53 appear to output relatively high voltage values, it is possible to easily detect the failure of the electric power supply 10, the voltage detectors 36 and 56, and the control device 20. As a result, it is possible to determine the soundness at a higher level.

In this embodiment, in a case where the value related to the voltage is equal to or greater than the first threshold values $S1_G$ and $S1_F$ in the first determination, the control device 20 determines that there is an abnormality. According to such a configuration, the first determination can be achieved by a relatively simple process. As a result, it is possible to determine the soundness at a higher level, while suppressing the necessary additional cost.

In the present embodiment, in a case where the value related to the voltage does not exceed the second threshold values $S2_G$ and $S2_F$ in the second determination, the control device 20 determines that there is an abnormality. According to such a configuration, the second determination can be achieved by a relatively simple process. As a result, it is possible to determine the soundness at a higher level, while suppressing the necessary additional cost.

Here, in the case where it takes time to start up the determinator 28a of the control device 20, when the startup of the processor is completed, a case where the converters 33 and 53 output relatively high voltage values is also assumed. In this case, it may be difficult to easily detect a failure of the voltage detector or the control device. However, in the present embodiment, the first predetermined times $T1_G$ and $T1_F$ are longer than the time required for the startup of the determinator 28a. According to such a configuration, even when it takes time to start up the determinator 28a, the determinator 28a can perform the first determination, on the basis of the state before starting the conversion operation of the converters 33 and 53. As a result, it is possible to more reliably determine the soundness at a higher level.

In the present embodiment, the determinator 28a starts the startup substantially at the same time as the electric power supply start time or after the electric power supply start time, and performs the first determination substantially simultaneously with the startup completion or within the second predetermined times $T2_G$ and $T2_F$ from the startup completion. According to such a configuration, before starting the conversion operation of the converters 33 and 53, the first determination can be more reliably performed. As a result, it is possible to more reliably determine the soundness at a higher level.

In the present embodiment, as the second determination, the determinator 28a determines whether the value related to the voltage exceeds the threshold value within the third predetermined times $T3_G$ and $T3_F$ that follows one of the electric power supply start time, the startup completion time of the determinator 28a, or the conversion operation start time of the converters 33 and 53. According to such a configuration, after the converters 33 and 53 start the conversion operation and output a voltage value equal to or greater than a certain value, the second determination can be more reliably performed. As a result, it is possible to more reliably determine the soundness at a higher level.

Although one embodiment has been described above, the configuration of the embodiment is not limited to the above example. For example, the expression "performs the first determination on the basis of the detection result detected by the detector before the elapse of the first predetermined time" means that the detection operation may be performed by the detector before the elapse of the first predetermined times $T1_G$ and $T1_F$, and the first determination of the determinator may be performed after the elapse of the first predetermined times $T1_G$ and $T1_F$.

Also, the first predetermined time $T1_G$ and the first predetermined time $T1_F$ may be the same or different. The second predetermined time $T2_G$ and the second predetermined time $T2_F$ may be the same or different. The third predetermined time $T3_G$ and the third predetermined time $T3_F$ may be the same or different. The electric power conversion system 1 may detects an abnormality of the electric power conversion system 1 on the basis of at least one of a detection result of the voltage detector 36 of the gate electric power supply device 30 and a detection result of the voltage detector 56 of the fan electric power supply device 50.

According to at least an embodiment described above, it is possible to determine the soundness at a higher level, by including a delay controllers for delaying the conversion operation start of a converter by the first predetermined time with respect to the supply start time at which supply of electric power from an electric power supply is started; and a determinator which performs a first determination on the basis of a detection result detected by the detector before the elapse of a first predetermined time from the supply start time, and performs a second determination on the basis of the detection result detected by the detector after the lapse of the first predetermined time from the electric power supply start time.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electric power conversion system comprising:
   a converter configured to convert electric power supplied from an electric power supply;
   a detector configured to detect a voltage value of the electric power converted by the converter;
   a delay controller, being a part of the converter or outside the converter, the delay controller being configured to delay a conversion operation start of the converter by a first predetermined time with respect to a supply start time at which supply of the electric power from the electric power supply is started; and
   a determinator configured
   to perform a first determination that determines that there is an abnormality when the voltage value is equal to or greater than a first threshold value, and determines that there is not the abnormality when the voltage value is lower than the first threshold value, the first determination being performed on the basis of a detection result detected by the detector, the first determination being performed in a state where a conversion operation of the converter is stopped, the first determination being performed before elapse of the first predetermined time from the supply start time, and
   to perform a second determination that determines that there is the abnormality when the voltage value does not exceed a second threshold value, and determines that there is not the abnormality when the voltage value becomes equal to or greater than the second threshold value, the second determination being performed on the basis of a detection result detected by the detector, the second determination being performed in a state where the conversion operation of the converter is performed, the second determination being performed after the elapse of the first predetermined time from the supply start time, wherein
   the second threshold value is a threshold value relative to which the voltage value detected by the detector becomes higher when the converter operates normally.

2. The electric power conversion system according to claim 1, wherein
   the first predetermined time is a time longer than a time required for startup of the determinator.

3. The electric power conversion system according to claim 2, wherein
   the determinator starts the startup substantially at the same time as the supply start time or after the supply start time, and performs the first determination substantially at the same time as a startup completion of the determinator or within a second predetermined time from the startup completion.

4. The electric power conversion system according to claim 1, wherein
   the determinator determines that there is the abnormality when the voltage value does not exceed the second threshold value within a third predetermined time which is set after the first predetermined time in the second determination.

5. The electric power conversion system according to claim 1, further comprising:
   a power line electrically connecting the converter to the electric power supply, the power line being configured to supply the electric power from the electric power supply to the converter, wherein
   the delay controller comprises a switching component, the switching component being provided on the power line between the electric power supply and the converter to switch the power line between a conducting state and a disconnected state, and the delay controller is configured to switch the power line from the disconnected state to the conducting state by controlling the switching component after the elapse of the first predetermined time from the supply start time, and the determinator is configured to perform the first determination based on a detection result detected by the detector in a state where the power line is in the disconnected state, and to perform the second determination based on a detection result detected by the detector in a state where the power line is in the conducting state.

6. The electric power conversion system according to claim 1, wherein the electric power conversion system is mounted on a vehicle, and the converter is configured to supply the electric power converted by the converter to a gate amplifier that is electrically connected to a circuit for a motor of the vehicle.

7. The electric power conversion system according to claim 5, further comprising:

a capacitor electrically connected to the power line between the switching component and the converter, wherein the capacitor is not supplied with the electric power from the electric power supply in a state where the power line is in the disconnected state, and is supplied with the electric power from the electric power supply and store the electric power in a state where the power line is in the conducting state, and the determinator is configured to perform the first determination based on a detection result detected by the detector in a state where the power line is in the disconnected state and the electric power is not supplied to the capacitor, and to perform the second determination based on a detection result detected by the detector in a state where the power line is in the conducting state and the electric power is supplied to the capacitor.

8. The electric power conversion system according to claim 1, wherein the electric power conversion system is mounted on a vehicle, and the converter is configured to supply the electric power converted by the converter to a fan of the vehicle.

9. The electric power conversion system according to claim 1, wherein the first threshold value is a threshold value relative to which the determinator determines whether the voltage value detected by the detector is substantially 0 V or not.

* * * * *